(12) United States Patent
Kim et al.

(10) Patent No.: US 7,622,742 B2
(45) Date of Patent: Nov. 24, 2009

(54) III-NITRIDE COMPOUND SEMICONDUCTOR LIGHT EMITTING DEVICE

(75) Inventors: Chang-Tae Kim, Seongnam-si (KR); Keuk Kim, Seongnam-si (KR); Soo-Kun Jeon, Kunsan-si (KR); Pil-Guk Jang, Yongin-si (KR); Jong-Won Kim, Kwangju-si (KR)

(73) Assignee: Epivalley Co., Ltd., Koomi (KR)

( * ) Notice: Subject to any disclaimer, the term of this patent is extended or adjusted under 35 U.S.C. 154(b) by 674 days.

(21) Appl. No.: 10/562,738

(22) PCT Filed: Jul. 2, 2004

(86) PCT No.: PCT/KR2004/001625

§ 371 (c)(1),
(2), (4) Date: Dec. 29, 2005

(87) PCT Pub. No.: WO2005/004247

PCT Pub. Date: Jan. 13, 2005

(65) Prior Publication Data

US 2007/0114511 A1    May 24, 2007

(30) Foreign Application Priority Data

| Jul. 3, 2003 | (KR) | ........................ 10-2003-0045059 |
| Aug. 12, 2003 | (KR) | ........................ 10-2003-0055907 |
| Oct. 10, 2003 | (KR) | ........................ 10-2003-0070758 |

(51) Int. Cl.
*H01L 27/15* (2006.01)
*H01S 5/00* (2006.01)
*H01L 21/311* (2006.01)

(52) U.S. Cl. .................... 257/79; 257/E29.01; 257/98; 372/46; 438/700

(58) Field of Classification Search ................... 257/79, 257/98, E29.01; 372/46; 438/700
See application file for complete search history.

(56) References Cited

U.S. PATENT DOCUMENTS

| 6,198,127 B1 * | 3/2001 | Kocon ....................... 257/328 |
| 6,379,985 B1 * | 4/2002 | Cervantes et al. ............ 438/33 |
| 6,420,735 B2 | 7/2002 | Kim |
| 6,441,403 B1 | 8/2002 | Chang et al. |

(Continued)

FOREIGN PATENT DOCUMENTS

JP    10-65213 A    3/1998

(Continued)

*Primary Examiner*—Howard Weiss
*Assistant Examiner*—Steven H Rao
(74) *Attorney, Agent, or Firm*—Husch Blackwell Sanders LLP

(57) ABSTRACT

The present invention relates to a III-nitride semiconductor light-emitting device having high external quantum efficiency, provides a III-nitride compound semiconductor light-emitting device including an active layer generating light by recombination of electrons and holes and containing gallium and nitrogen, an n-type Al(x)In(y)Ga(1-x-y)N layer epitaxially grown before the active layer is grown, and an n-type electrode electrically contacting with the n-type Al(x)In(y)Ga (1-x-y)N layer, in which the n-type Al(x)In(y)Ga(1-x-y)N layer has a surface which is exposed by etching and includes a region for scribing and breaking the device and a region for contact with the n-type electrode, and the surface of the region for scribing and breaking the device is roughened, thereby it is possible to increase external quantum efficiency of the light-emitting device.

13 Claims, 9 Drawing Sheets

U.S. PATENT DOCUMENTS

| | | | |
|---|---|---|---|
| 6,504,180 B1 | 1/2003 | Heremans et al. | |
| 6,750,508 B2 * | 6/2004 | Omura et al. | 257/329 |
| 7,061,066 B2 * | 6/2006 | Kocon | 257/476 |
| 7,192,872 B2 * | 3/2007 | Chen | 438/700 |
| 2004/0013148 A1 * | 1/2004 | Kwak et al. | 372/46 |
| 2005/0082562 A1 * | 4/2005 | Ou et al. | 257/103 |

FOREIGN PATENT DOCUMENTS

| | | |
|---|---|---|
| JP | 2002-16312 A | 1/2002 |
| KR | 2003-52060 A | 6/2003 |

\* cited by examiner

III-NITRIDE COMPOUND SEMICONDUCTOR LIGHT EMITTING DEVICE

TECHNICAL FIELD

The present invention relates to a III-nitride semiconductor light-emitting device, and more particularly, to a III-nitride semiconductor light-emitting device having high external quantum efficiency. The III-nitride compound semiconductor refers to a semiconductor of an $Al(x)In(y)Ga(1-y)N$ type but may include semiconductors formed using elements of different groups such as SiC, SiN and SiCN or elements themselves.

BACKGROUND ART

A variety of attempts have been made to improve external quantum efficiency of a light-emitting device. Among them, methods for roughening an exposed surface of a light-emitting device have been presented.

U.S. Pat. No. 6,504,180 related to a GaAs based light-emitting device discloses a technology wherein at least some of an exposed surface of a light-emitting device is roughened so as to improve external quantum efficiency.

The reason why a desired portion of the exposed surface of the GaAs based light-emitting device can be made rough freely is that GaAs has the material property in which it can be easily machined.

However, a GaN based light-emitting device has lots of limitations in machining an exposed surface unlike a GaAs based light-emitting device. These limitations may include that it is difficult to machine an n-type layer since a substrate such as sapphire is provided in the n-type layer, growth of a thick p-type GaN layer results in an increase in crystalline defects even though the thick p-type GaN layer is required for machining, etc. It is therefore difficult to apply such a technology applied to the GaAs based light-emitting device to the GaN based light-emitting device without hard work. In order to improve external quantum efficiency by roughening the exposed surface of the GaN based light-emitting device, it will need an approach based on understanding of the GaN based light-emitting device itself. Furthermore, according to U.S. Pat. No. 6,504,180, polystyrene spheres are used as a mask in order to make an exposed surface rough. It is, however, difficult to apply an etching technology, which uses polystyrene spheres as a mask, to the GaN based light-emitting device.

U.S. Pat. No. 6,441,403 regarding the GaN based light-emitting device discloses a light-emitting device in which a roughened surface is formed on a p-type $Al(x)Ga(y)In(1-x-y)N$ layer epitaxially grown on an active layer or an n-type $Al(x)Ga(y)In(1-x-y)N$ layer epitaxially grown on an active layer. Such a structure shows that it is difficult to form a roughened surface on an n-type $Al(x)Ga(y)In(s-x-y)N$ layer in a conventional light-emitting device structure in which the n-type $Al(x)Ga(y)In(1-x-y)N$ layer is located below an active layer.

DISCLOSURE

TECHNICAL PROBLEM

Accordingly, the present invention has been made in view of the above problems, and it is a n object of the present invention to provide a III-nitride compound semiconductor light-emitting device that can increase external quantum efficiency in a conventional light-emitting device structure in which an n-type $Al(x)Ga(y)In(1-x-y)N$ layer is located below an active layer.

Another object of the present invention is to provide a III-nitride compound semiconductor light-emitting device which can increase external quantum efficiency while taking notice of room spaces for the purpose of a scribing and breaking process in which light-emitting device is scribed and broken, which located around the light portion of chip.

TECHNICAL SOLUTION

To achieve the above objects, according to the present invention, there is provided a III-nitride compound semiconductor light-emitting device having a plurality of III-nitride compound semiconductor layers that are epitaxially grown using a substrate, wherein the plurality of III-nitride compound semiconductor layers include an active layer generating light by recombination of electrons and holes and containing gallium and nitrogen, an n-type $Al(x)In(y)Ga(1-x-y)N$ layer epitaxially grown before the active layer is grown, and an n-type electrode electrically contacting with the n-type $Al(x)In(y)Ga(1-x-y)N$ layer, and wherein the n-type $Al(x)In(y)Ga(1-x-y)N$ layer has a surface which is exposed by etching and includes a region for scribing and breaking the device and a region for contact with the n-type electrode, and the surface of the region for scribing and breaking the device is roughened.

Meanwhile, the present invention does not exclude out that an exposed surface at the region for contact with n-type electrode is roughened through an additional etching process.

ADVANTAGEOUS EFFECTS

In the present invention, by taking notice of an exposed surface of an s n-type $Al(x)In(y)Ga(1-x-y)N$ layer to which attention has not yet been paid in a GaN based light-emitting device, a roughened surface is formed on the exposed surface. It is therefore possible to increase external quantum efficiency of the light-emitting device.

Furthermore, a roughened surface can be formed in an etching process for forming an n-type electrode. Therefore, the present invention has an advantageous effect in that external quantum efficiency of a light-emitting device is increased without changing the structure of a GaN based light-emitting device or the need for an additional complex process.

MODE FOR INVENTION

EXAMPLE 1

Figure 1:
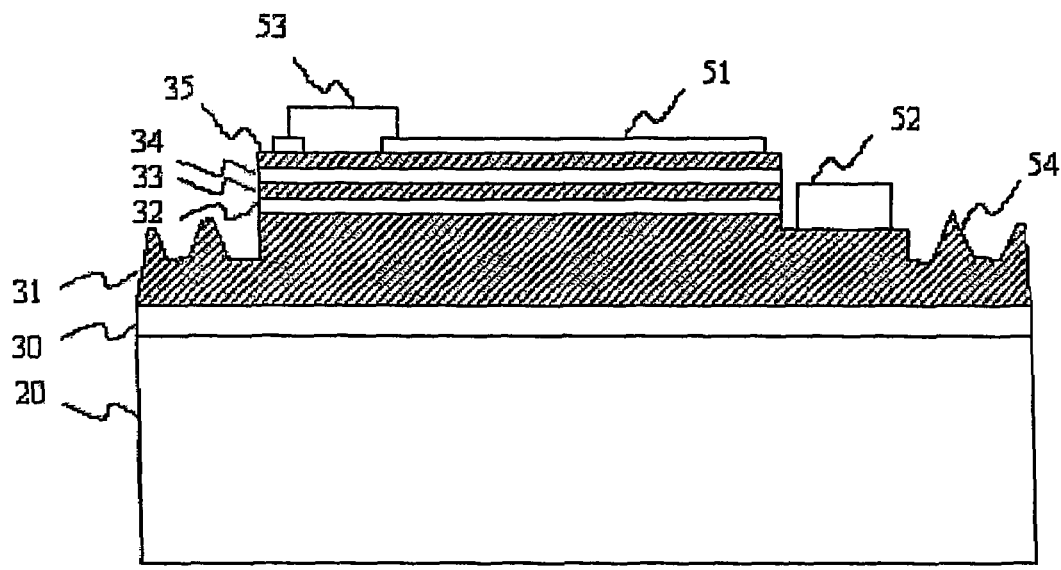
FIG. 1 is a cross-sectional view of a nitride semiconductor light-emitting device according to a first embodiment of the present invention.
Figure 2:
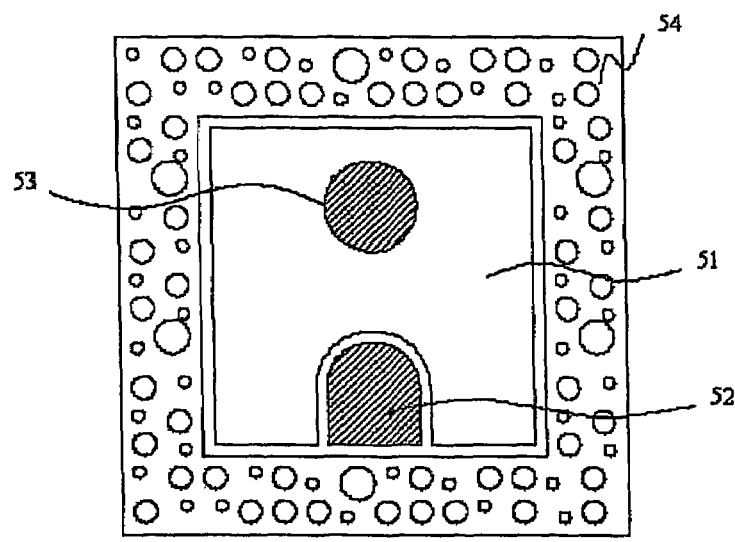
FIG. 2 is a plan view of the light-emitting device shown in FIG. 1.

FIG. 1 is a cross-sectional view of a nitride semiconductor light-emitting device according to a first embodiment of the present invention. FIG. 2 is a plan view of the light-emitting device shown in FIG. 1.

Referring to FIG. 1, the light-emitting device includes a substrate 20, a buffer layer 30 epitaxially grown on the substrate 20, an n-type Al(x)In(y)Ga(1-x-y)N layer 31 epitaxially grown on the buffer layer 30, an active layer 33 epitaxially grown on the n-type Al(x)In(y)Ga(1-x-y)N layer 31, a p-type Al(a)In(b)Ga(1-a-b)N layer 35 epitaxially grown on the active layer 33, a p-type electrode 51 and a p-type bonding pad 53 that electrically contact with the p-type Al(a)In(b)Ga(1-a-b)N layer 35, and an n-type electrode 52 that electrically contacts with the n-type Al(x)In(y)Ga(1-x-y)N layer 31. Also, protrusions 54 are formed on an exposed surface of the n-type Al(x)In(y)Ga(1-x-y)N layer 31.

The present invention can be applied to light-emitting devices having a variety of epitaxial structures. FIG. 1 shows the light-emitting device of an epitaxial structure in which an n-type Al(x1)In(y1)Ga(1-x1-y1)N clad layer 32 is located between the n-type Al(x)In(y)Ga(1-x-y)N layer 31 and the active layer 33 and a p-type Al(a1)In(b1)Ga(1-a1-b1)N clad layer 34 is located between the active layer 33 and the p-type Al(a)In(b)Ga(1-a-b)N layer 35.

It is, however, to be noted that the present invention is not limited to the above-mentioned epitaxial structure but can be applied to any kind of a III-nitride compound semiconductor light-emitting device having the n-type Al(x)In(y)Ga(1-x-y)N layer 31, which is located below an active layer and serves as an electrical contact layer of the n-type electrode 52. It is preferred that the n-type Al(x)In(y)Ga(1-x-y)N layer 31 is formed using GaN. The layer 31 may be a multi-layer made of Al(a2)In(b2)Ga(1-a2-b2)N/Al(a3)In(b3)Ga(1-a3-b3)N or an n-type contact layer of a superlattice structure.

If the light-emitting device is completed, a scribing/breaking process is performed in order to package the light-emitting device. For the purpose of the scribing/breaking process, room space of about 40 to 60 λm is needed between neighboring devices. This room space is intended only for a process margin without any special reason. In the present invention, the protrusions 54 are formed in this room space.

The size of each of the protrusions 54 is not limited to a specified range but greater than ¼ of the peak wavelength of light generated from the light-emitting device. The higher the density of the surface protrusions 54 becomes, the greater the amount of the photons that escape from the device becomes.

Figure 3:
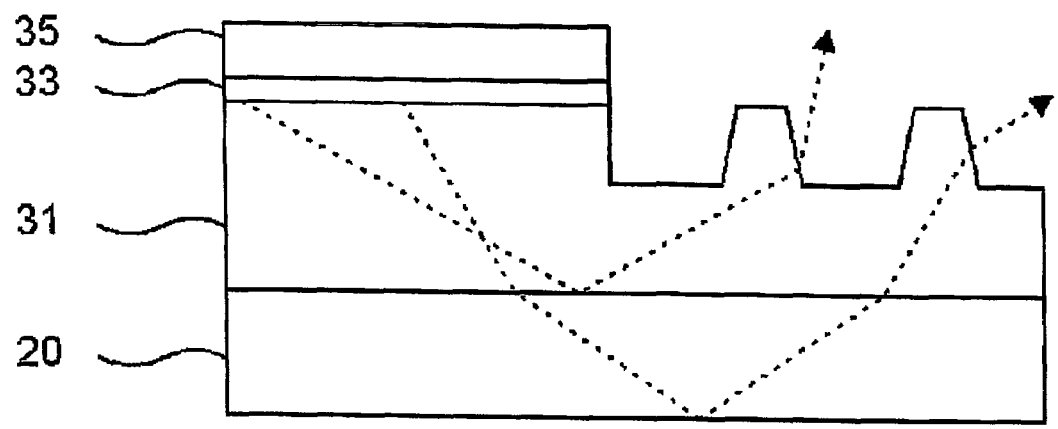
FIG. 3 is a conceptual view showing that light escapes outwardly by means of protrusions 54.

FIG. 3 is a conceptual view showing that light escapes outwardly by means of the protrusions 54. It can be seen from FIG. 3 that light generated from the active layer 33 escapes outwardly effectively since protrusions and depressions are formed in edge portion other than light-emitting portion of the light-emitting device.

If the protrusions 54 are formed in the room space at the edge portion of a chip through a photolithography process, the size and density of the protrusions are limited due to the limitation of the pattern size formed on a mask used in the photolithography process.

In order to overcome such limitation, according to the present invention, the mask pattern is not formed by means of the photolithography process, but the protrusions 54 are formed by dry-etching the n-type Al(x)In(y)Ga(1-x-y)N layer 31 using etching residues generated automatically upon the etching of the n-type Al(x)In(y)Ga(1-x-y)N layer 31 as a mask pattern.

The dry etching process usually employs plasma. The dry etching process can be performed only in a physically manner and can be performed with the help of a chemical reaction. For example, in case of reactive ion etching, ions having high energy take off a material to be etched and are chemically bonded with particles taken off from the material at the same time, so that etching is performed. At this time, the particles taken off from the material while being chemically bonded with the ions become etching residues.

The etching residues may exist in the gas or solid state depending on a material that is removed and may be different in characteristic that is removed depending on the pressure of a vacuum chamber in which a process is performed. That is, if the pressure of the vacuum chamber is low, the exhaust is performed easily since the mean free path of the etching residues is long. If the pressure of the vacuum chamber is high, the etching residues remain on the etched surface because the mean free path of the etch residues is short. The etching residues remaining on the etched surface serve as an etch mask. The roughness of the etched surface becomes thus great.

Figure 4:
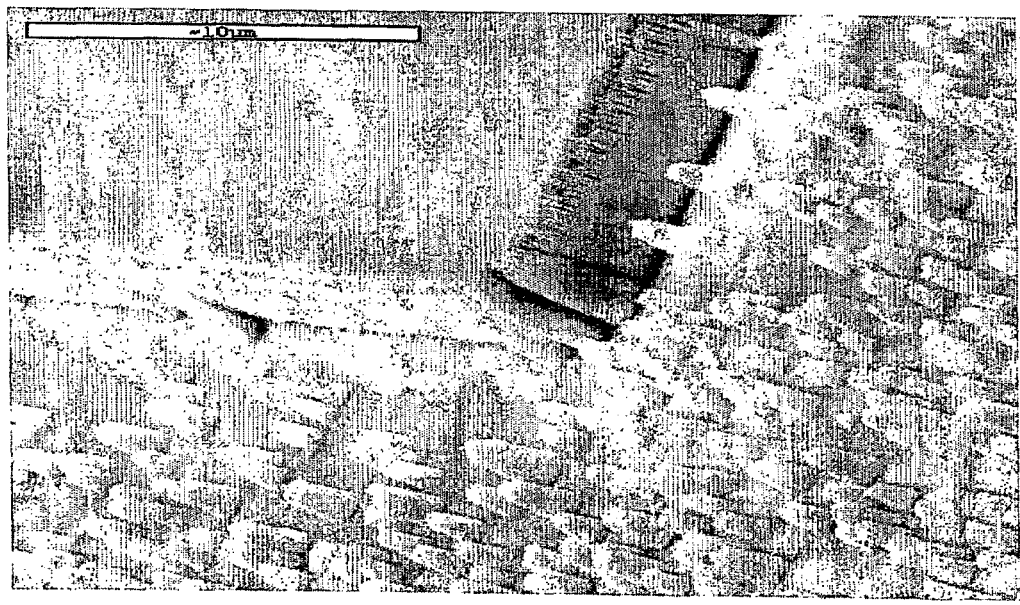
FIG. 4 shows an electron microscope photograph of a roughened surface formed according to the present invention.

FIG. 4 shows an electron microscope photograph of a roughened surface formed according to the present invention. From FIG. 4, it can be seen that the protrusions 54 have approximately a conical shape. The diameter of the bottom of the conical shape may be in the range of 1 nm to 10 μm and the height of the conical shape may be in the range of 1 nm to 10 μm.

Figure 5:
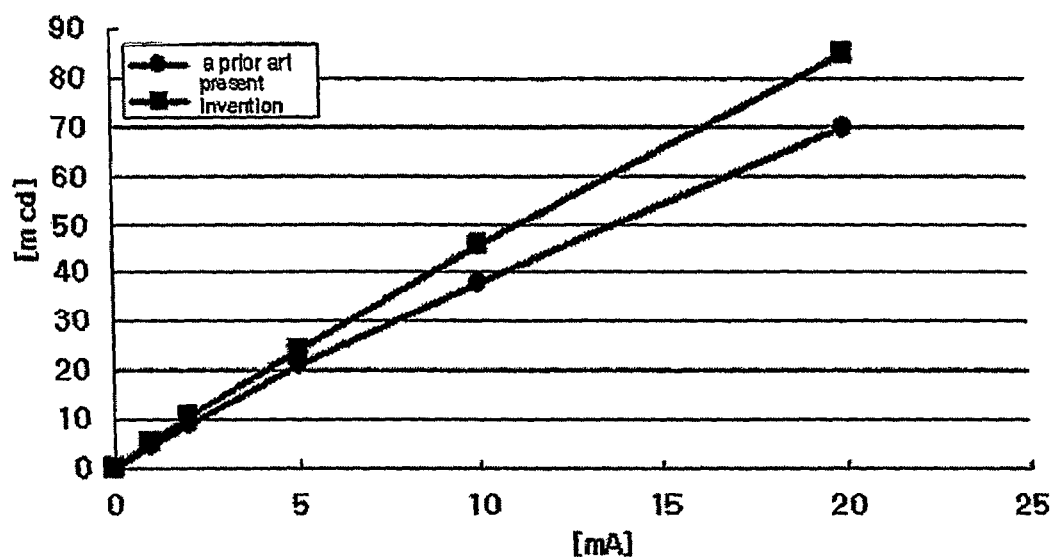
FIG. 5 is a graph showing the relationship between the current applied and the brightness in a prior art and the present invention.

FIG. 5 is a graph showing the relationship between the current applied S and brightness in a prior art and the present invention. From FIG. 5, it can be seen that brightness of the present invention is higher about 20% to 25% than that of the prior art, even though it has a little difference depending on the roughness of the surface.

EXAMPLE 2

Figure 6:
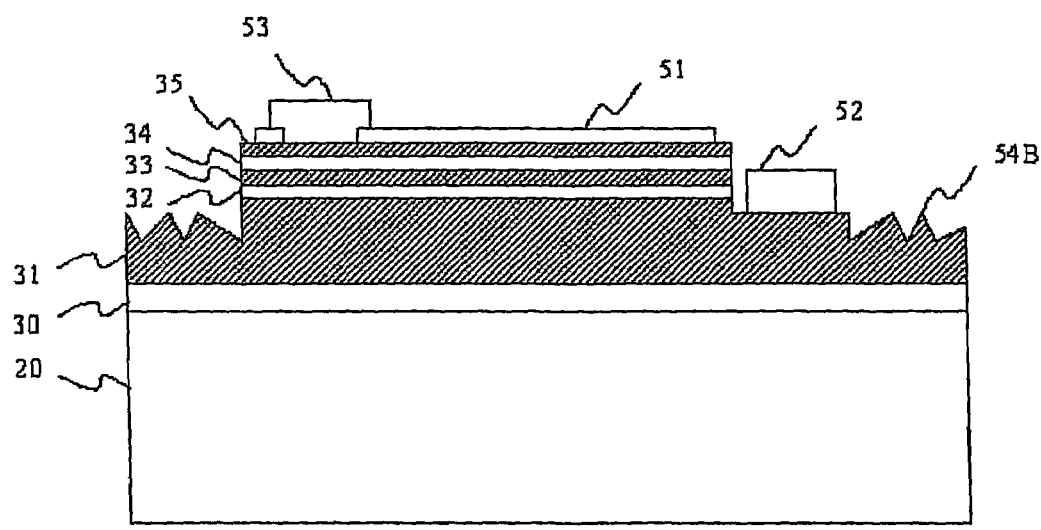
FIG. 6 is a cross-sectional view showing a nitride semiconductor light-emitting device according to a second embodiment of the present invention.
Figure 7:
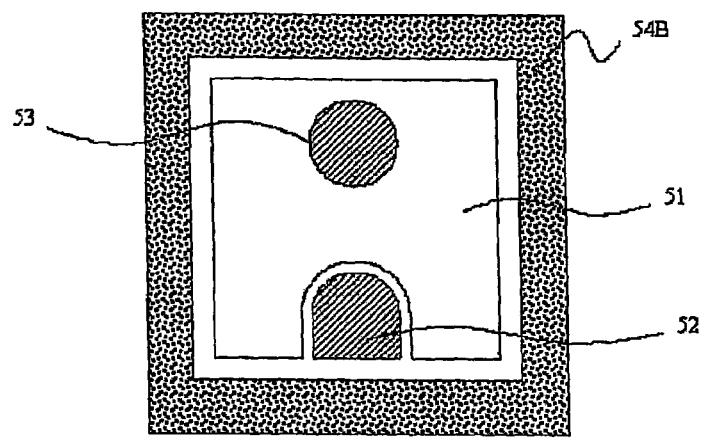
FIG. 7 is a plan view of the light-emitting device shown in FIG. 6.

FIG. 6 is a cross-sectional view showing a nitride semiconductor light-emitting device according to a second embodiment of the present invention. FIG. 7 is a plan view of the light-emitting device shown in FIG. 6. A roughened surface 54B in FIG. 6 is formed by means of photoelectrochemical etching.

Figure 8:
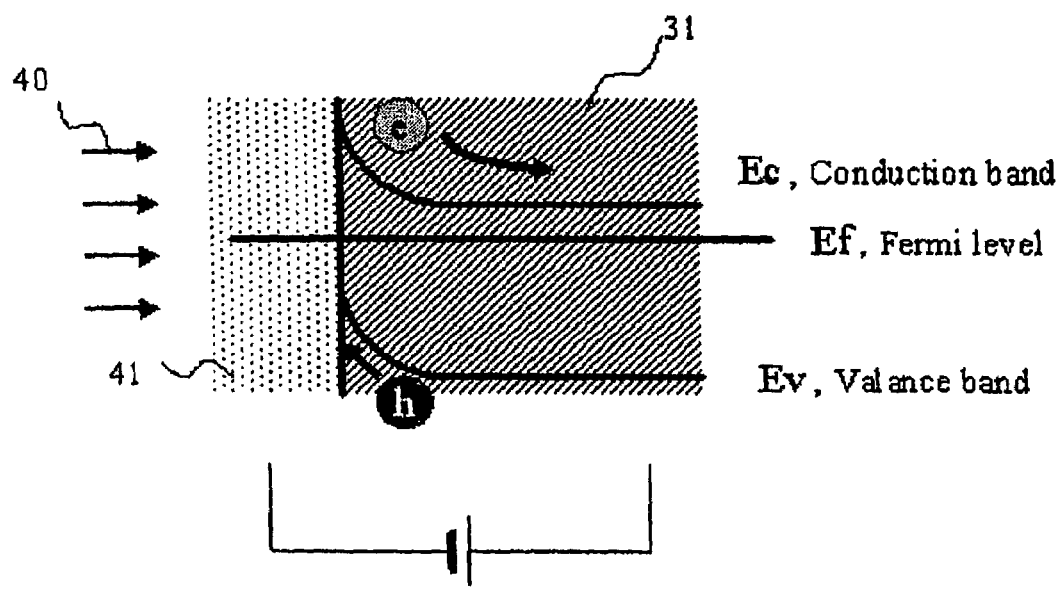
FIG. 8 is a view showing the principle of photoelectrochemical etching that occurs at a portion where a n-type Al(x)In(y)Ga(1-x-y)N layer 31 and an etching solution 41 are in contact with each other.

FIG. 8 is a view showing the principle of photoelectrochemical etching that is generated at a portion where the n-type Al(x)ln(y)Ga(1-x-y)N layer 31 and an etch solution 41 contact with each other.

When an ultraviolet ray 40 is irradiated to the n-type Al(x)ln(y)Ga(1-x-y)N layer 31, electrons and holes are formed on the surface of the n-type Al(x)ln(y)Ga(1-x-y)N layer 31 by means of exitation energy. The electrons (e) formed move into the semiconductor and the holes (h) move to the surface of the semiconductor.

If the n-type Al(x)ln(y)Ga(1-x-y)N layer 31 is GaN, the holes (h) that moved to the surface of the semiconductor are combined with GaN to separate gallium (Ga) molecules and nitrogen (N) molecules, thus causing etching. The principle of etching to which the holes (h) contribute can be expressed as follows; $2GaN+6H^+ \text{---}>2Ga^{3+}+N_2$. DC power applied at this time helps movement of the holes (h) to make the etch rate fast.

If lattice defects exist, the etch rate is accelerated. The GaN semiconductor usually has the lattice defect density from $1\times10^6 cm^{-3}$ to $1\times10^{10} cm^{-3}$. Therefore, if the above-mentioned p photoelectrochemical etching is performed, the surface of the semiconductor is etched irregularly, forming a roughened surface.

Figure 9:
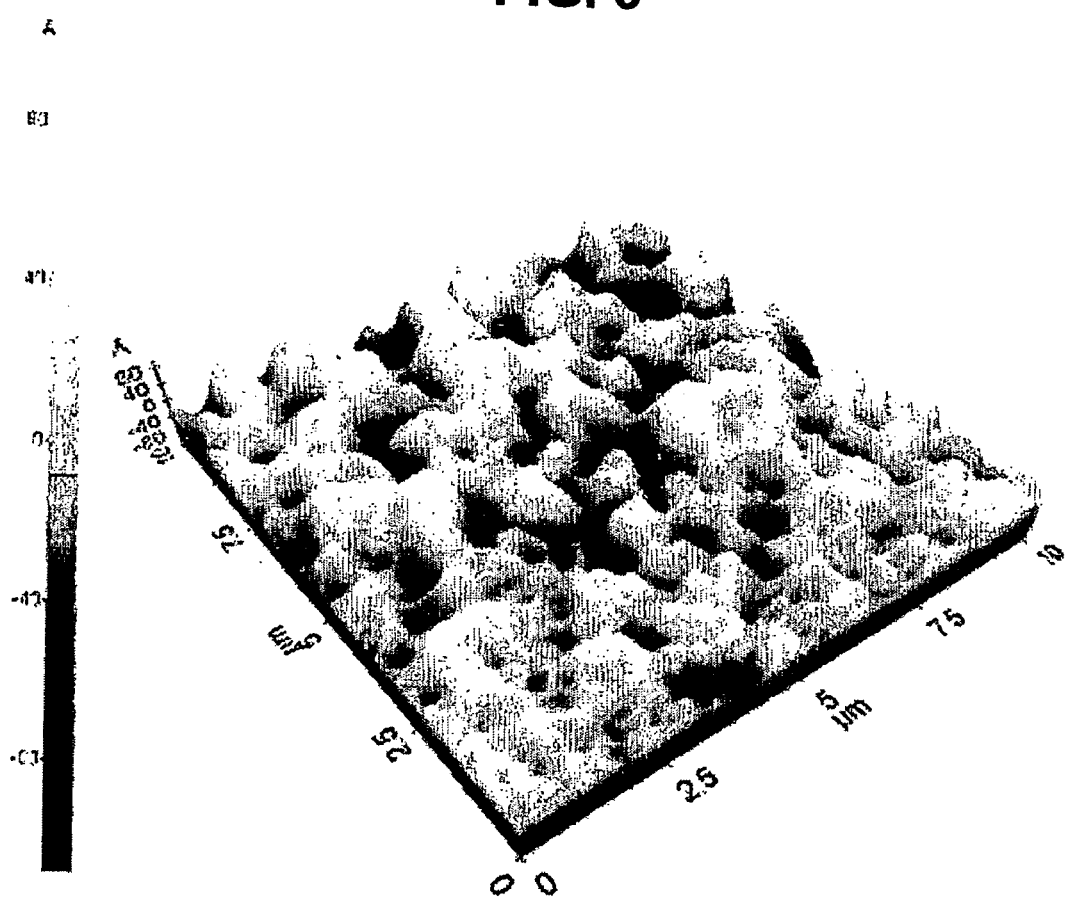
FIG. 9 and FIG. 10 are AFM (Atomic Force Microscope) photographs of a roughened surface formed according to the present invention.

FIG. 9 is the AFM photograph after etching is performed using a KOH solution being KOH:DI (deionized water)=500 g: 1500 cc as an etching is solution 41 for 2 minutes. It can be seen that the etch rate rises as the amount of KOH rises. An rms (root mean square) value as the surface roughness is about 7 nm.

Figure 10:
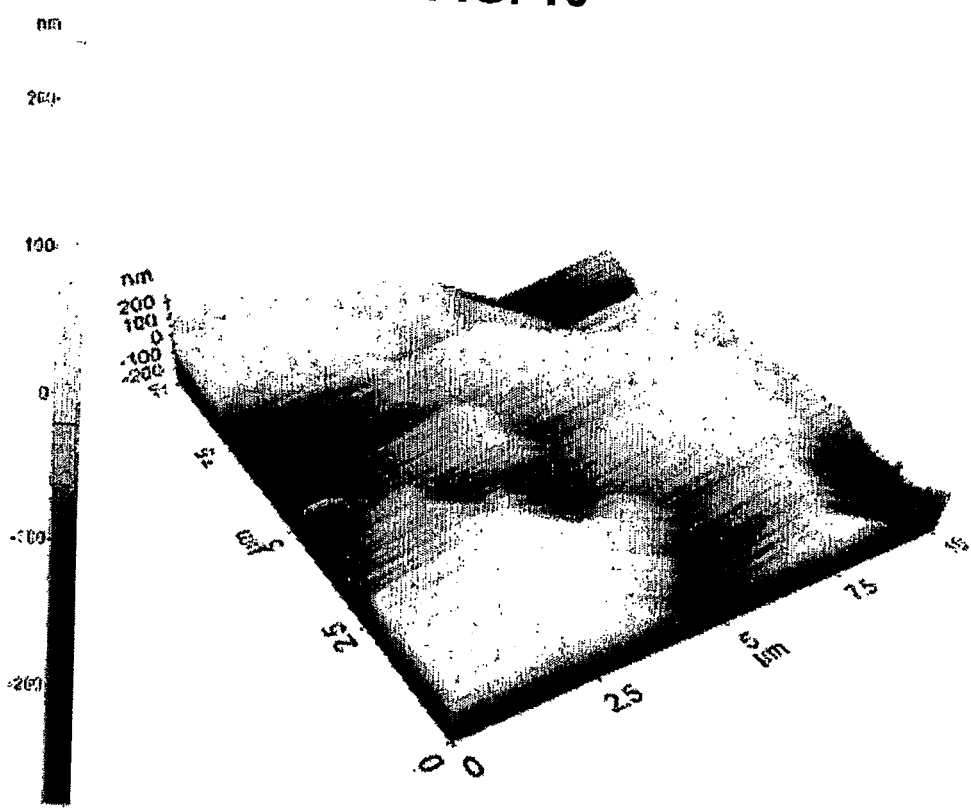

FIG. 10 is an AFM photograph after etching is performed for 9 minutes. An rms value as the surface roughness is about 500 nm. Therefore, it can be seen that the surface unconformity increases as the etch time increases. Accordingly, the amount of extracted light increases.

Figure 11:
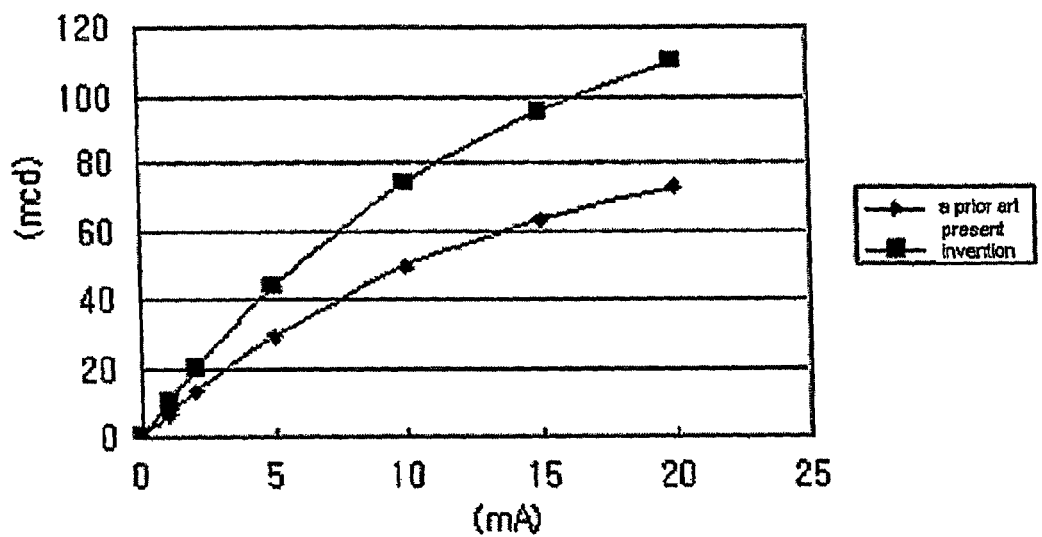
FIG. 11 is a graph showing the relationship between the current applied and brightness in a prior art and the present invention.

FIG. 11 is a graph showing the relationship between the current applied and brightness in a prior art and the present invention. From FIG. 11, it can be seen that brightness of the present invention is higher about 30 to 60% than the prior art, even though it has a little difference depending on the size and shape of a protrusion portion 54B.

Besides KOH, ammonia, and hydrochloric acid, etc. is used in the photoelectrochemical etching as an etching solution.

EXAMPLE 3

Figure 12:
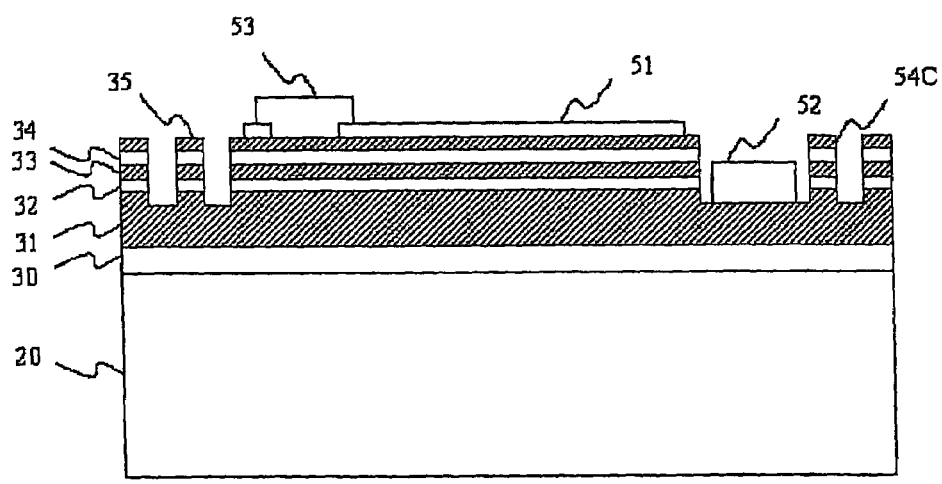
FIG. 12 is a cross-sectional view of a nitride semiconductor light-emitting device according to a third embodiment of the present invention.
Figure 13:
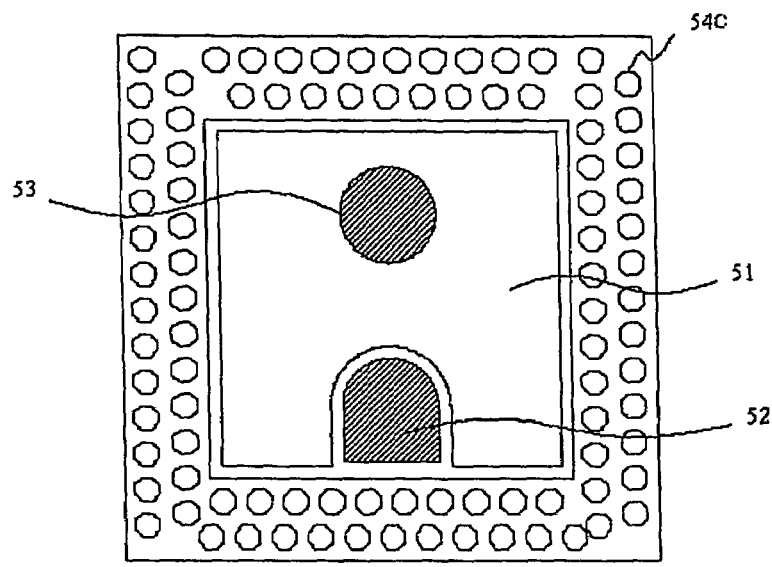
FIG. 13 is a plan view of the light-emitting device shown in FIG. 12.

FIG. 12 is a cross-sectional view of a nitride semiconductor light-emitting device according to a third embodiment of the present invention. FIG. 13 is a plan view of the light-emitting device shown in FIG. 12. Roughened surface 54C in FIG. 12 is formed by surface gratings.

The shape of the surface grating 54C formed using a mask pattern can be hexagonal, square, triangular or the like and a combination of 2 or 2 or more of them. Each of the surface gratings may have a predetermined size.

In order to maximize the density of the surface gratings 54C, it is preferred that the shape of the surface grating 54C is hexagonal. Also, it is preferred that the surface area of the surface grating is in the range of 1.5 µm² to 4 µm² and the height of the surface grating is in the range of 0.5 µm to 1.5 µm. The portion in which the surface gratings 54C are formed is the edge region other than the region which is the light-emitting portion of the device and the region for contact with the n-type electrode 52.

Typically, in order to fabricate a light-emitting device, both the p-type Al(a)ln(b)Ga(1-a-b)N layer 35 and the active layer 33 and some of the n-type Al(x)ln(y)Ga(1-x-y)N layer 31 are eliminated. Then, an n-type electrode is formed on the n-type Al(x)ln(y)Ga(1-x-y)N layer 31. At this time, a dry etch process is used as a process for eliminating several layers.

According to the present invention, the region for the surface gratings 54C is formed in the region other than the light-emitting portion of the device. Accordingly, there is an advantage in that such roughened surface is formed simultaneously when the device is etched by means of a dry etch from the p-type Al(a)ln(b)Ga(1-a-b)N layer 35 to some of the n-type Al(x)ln(y)Ga(1-x-y)N layer 31.

The surface gratings 54C are formed at the same time in the etching process that is inevitable in a device process. Therefore, it is not required to fabricate an additional photolithography process mask. Also, an additional process of forming surface gratings is not necessary. Resultantly, there is an advantage in that additional process time is not required as compared to a typical device. Of all things, there is an advantage in that the surface area of a device can be employed in an efficient manner.

Figure 14:
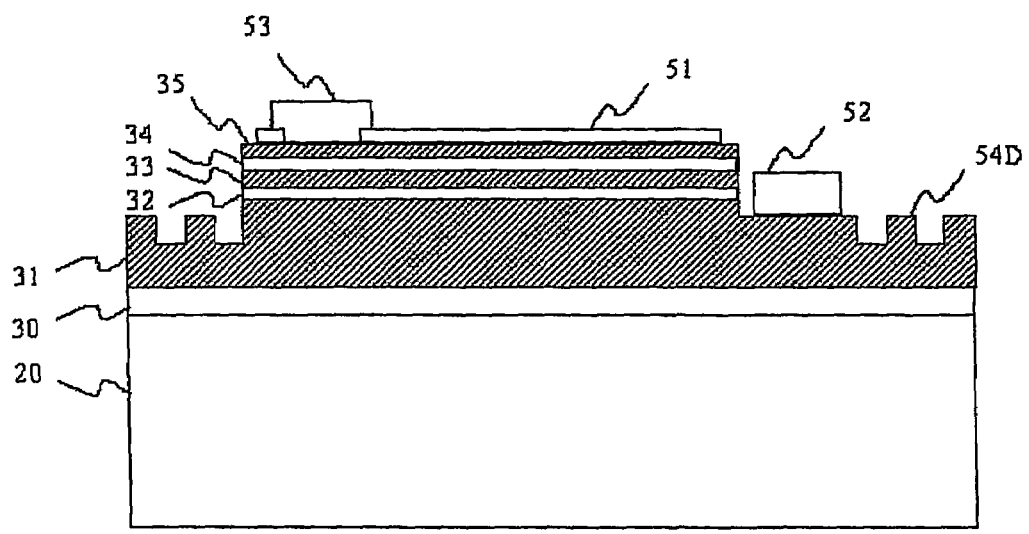
FIG. 14 shows a modified example of the third embodiment.

FIG. 14 shows a modified example of the third embodiment. After a region to which an n-type electrode 52 will be bonded is subjected to dry etching, the n-type Al(x)ln(y)Ga(1-x-y)N layer 31 experiences dry etching again, thereby forming surface gratings 54D.

Figure 15:
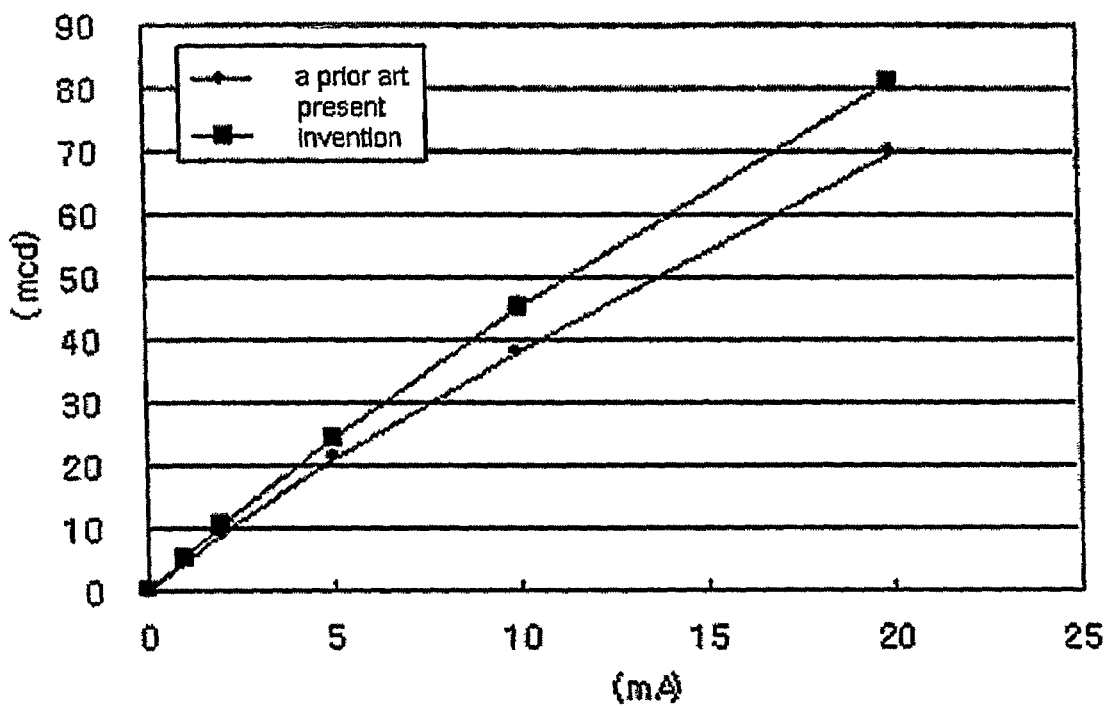
FIG. 15 is a graph showing the relationship between the current applied and brightness in a prior art and the present invention.

FIG. 15 is a graph showing the relationship between the current applied and brightness in a prior art and the present invention. From FIG. 15, it can be seen that brightness of the present invention is higher about 10 to 15% than the prior art although it has a little difference depending on the size and shape of the protrusion portions 54D.

The invention claimed is:

1. A III-nitride compound semiconductor light-emitting device comprising:
   a plurality of III-nitride compound semiconductor layers that are epitaxially grown using a substrate, the plurality of III-nitride compound semiconductor layers including:
      an active layer generating light by recombination of electrons and holes and containing gallium and nitrogen,
      an n-type Al(x)ln(y)Ga(1-x-y)N layer epitaxially grown before the active layer is grown, and
      an n-type electrode electrically contacting with the n-type Al(x)ln(y)Ga(1-x-y)N layer, and
   wherein the n-type Al(x)ln(y)Ga(1-x-y)N layer has a top surface which is exposed by etching, the exposed top surface includes a region for scribing and breaking the device and a region for contact with the n-type electrode, and a top surface of the region for scribing and breaking the device including a roughened surface such that light generated from the active layer escapes outwardly from the device through said roughened surface.

2. The III-nitride compound semiconductor light-emitting device of claim 1, wherein the roughened top surface of the region for scribing and breaking the device is formed by dry etching.

3. The III-nitride compound semiconductor light-emitting device of claim 2, wherein a mask pattern is used in the dry etching.

4. The III-nitride compound semiconductor light-emitting device of claim 3, wherein surface gratings are formed by means of the mask pattern, the surface area of each of the surface gratings is in a range of 1.5 µm² to 4 µm².

5. The III-nitride compound semiconductor light-emitting device of claim 3, wherein surface gratings are formed by means of the mask pattern, the height of each of the surface gratings is in a range of 0.5 μm to 1.5 μm.

6. The III-nitride compound semiconductor light-emitting device of claim 3, wherein etching residues are used as the mask pattern in the dry etching.

7. The III-nitride compound semiconductor light-emitting device of claim 6, wherein protrusions are formed by mean of the mask pattern and each of the protrusions has a conical shape.

8. The III-nitride compound semiconductor light-emitting device of claim 7, wherein the diameter of the bottom of the conical shape is in the range of 1 nm to 10 μm.

9. The III-nitride compound semiconductor light-emitting device of claim 7, wherein the height of the conical shape is in the range of 1 nm to 10 μm.

10. The III-nitride compound semiconductor light-emitting device of claim 1, wherein the roughened top surface of the region for scribing and breaking the device is formed by wet etching.

11. The III-nitride compound semiconductor light-emitting device of claim 10, wherein the wet etching is a photoelectrochemical etching.

12. The III-nitride compound semiconductor light-emitting device of claim 11, wherein KOH solution is used as an etching solution in the photoelectrochemical etching.

13. The III-nitride compound semiconductor light-emitting device of claim 3, wherein the dry etching is performed after the region for contact with the n-type electrode is etched.

* * * * *